United States Patent
Sperlich et al.

(10) Patent No.: US 7,814,450 B2
(45) Date of Patent: Oct. 12, 2010

(54) ACTIVE SKEW CONTROL OF A DIGITAL PHASE-LOCK LOOP USING DELAY LOCK-LOOPS

(75) Inventors: Roland Sperlich, Dallas, TX (US); Amer Hani Atrash, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 365 days.

(21) Appl. No.: 11/967,079

(22) Filed: Dec. 29, 2007

(65) Prior Publication Data

US 2008/0157840 A1 Jul. 3, 2008

Related U.S. Application Data

(60) Provisional application No. 60/883,018, filed on Dec. 31, 2006.

(51) Int. Cl.
*G06F 17/50* (2006.01)
(52) U.S. Cl. ................. 716/6; 716/1; 716/4; 716/5
(58) Field of Classification Search ............ 716/1, 716/4, 5, 6
See application file for complete search history.

(56) References Cited

U.S. PATENT DOCUMENTS

| | | | | |
|---|---|---|---|---|
| 3,208,066 A | * | 9/1965 | Cordry | 342/171 |
| 4,328,496 A | * | 5/1982 | White | 342/15 |
| 4,675,628 A | * | 6/1987 | Rosen | 333/164 |
| 5,198,758 A | * | 3/1993 | Iknaian et al. | 714/724 |
| 5,355,037 A | * | 10/1994 | Andresen et al. | 327/158 |
| 5,552,733 A | * | 9/1996 | Lesmeister | 327/295 |
| 5,764,187 A | * | 6/1998 | Rudish et al. | 342/372 |
| 5,943,010 A | * | 8/1999 | Rudish et al. | 342/372 |
| 6,087,868 A | * | 7/2000 | Millar | 327/156 |
| 6,281,725 B1 | * | 8/2001 | Hanzawa et al. | 327/152 |
| 7,154,259 B2 | * | 12/2006 | Miller | 324/158.1 |
| 7,729,429 B1 | * | 6/2010 | Sutardja | 375/258 |
| 2002/0169994 A1 | * | 11/2002 | Yang | 713/503 |
| 2003/0081709 A1 | * | 5/2003 | Ngo et al. | 375/362 |

* cited by examiner

*Primary Examiner*—Sun J Lin
(74) *Attorney, Agent, or Firm*—John J. Patti; Wade J. Brady, III; Frederick J. Telecky, Jr.

(57) ABSTRACT

Systems and methods for transmitting a signal having a desired phase at the device are disclosed. The systems and methods further include determining a signal path length to a device over a transmission line and adding a delay to a signal to be transmitted over the transmission line. The determination is made in response to determining the path length to the device.

4 Claims, 3 Drawing Sheets

ACTIVE SKEW CONTROL OF A DIGITAL PHASE-LOCK LOOP USING DELAY LOCK-LOOPS

CROSS-REFERENCE TO RELATED APPLICATIONS

This application claims priority to U.S. provisional application Ser. No. 60/883,018, filed on Dec. 31, 2006, the entire contents of which are incorporated by reference herein.

TECHNICAL FIELD

The invention relates generally to a phase-lock loop (PLL) and, more particularly, to a PLL with active skew control.

BACKGROUND

In many applications, signals that are generated at a first location and transmitted to a second location need to arrive at the second location having a desired phase. It may be difficult, however, to control the phase in cases where the signal path length from the first to the second location is not well known. This may be the case, for example, when clock generators generate clock signals that are to be sent to multiple devices over different signal paths on a board. Though it may be desirable for the clock signals to arrive at the devices having the same phase, differences in delays that may be added by the different signal paths, for example, may lead to the clock signals arriving at the different devices having different phases.

Turning to FIG. 1, an example of a conventional clock distribution network 100. Network 100 generally comprises a PLL 102, compensation circuits 104-1 to 104-N (which respectively include DLLs 106-1 to 106-N and delay controllers 108-1 to 108-N), and devices under test (DUTs) 110-1 to 110-N. As can be seen, the compensation circuits 104-1 to 104-N are located near the DUTs 110-1 to 110-N, allowing for manual skew compensation. As a result, calibrating the network 100 is time consuming and difficult, and any changes to the network 100 would generally require recalibration

SUMMARY

A preferred embodiment of the present invention, accordingly, provides an apparatus. The apparatus comprises a clock signal generator; a plurality of delay-lock loops (DLLs) that are each coupled to the clock signal generator; a plurality of transmission lines, wherein each transmission line is coupled to at least one of the DLLs; and a delay controller that is coupled to each DLLs so as to control the delay for each DLL based at least in part on the length of its associated transmission line, wherein the delay controller computes the length of each transmission line based at least in part on a roundtrip time and amplitude for a reflection of a test signal transmitted over each transmission line.

In accordance with a preferred embodiment of the present invention, the clock signal generator further comprises: a voltage-controlled crystal oscillator (VCXO); and a phase-lock loop (PLL) that is coupled to the VCXO.

In accordance with a preferred embodiment of the present invention, the delay controller ignores false reflections using an estimated roundtrip time and an estimated amplitude for the test signal.

In accordance with a preferred embodiment of the present invention, the apparatus further comprises a plurality of devices, wherein each device is coupled to at least one of the transmission lines.

In accordance with a preferred embodiment of the present invention, disclosed is a method for transmitting a signal, the method comprising: determining a signal path length to a device over a transmission line and adding a delay to a signal to be transmitted over the transmission line in response to the determining the path length to the device, the signal having a desired phase at the device.

In accordance with a preferred embodiment of the present invention, disclosed is a delay device comprising: a delay controller; and a delay generator coupled to the delay controller, the delay generator being coupled to a transmission line, the transmission line coupling a signal generator and a device; the delay controller being configured to determine a signal path length from the signal generator to the device; and the delay generator being configured to add a delay to a signal to be transmitted over the transmission line in response to the delay controller determining the signal path length to the device, the signal having a desired phase at the device.

In accordance with a preferred embodiment of the present invention, disclosed is a computer program product stored on a computer operable medium, the computer program product comprising software code being effective to: determine a signal path length to a device over a transmission line; and add a delay to a signal to be transmitted over a transmission line in response to the system determining the signal path length to the device, the signal having a desired phase at the device.

In accordance with a preferred embodiment of the present invention, disclosed is an information handling system comprising: one or more processors; a memory unit coupled to the one or more processors; a communications device coupled to the one or more processors; and a delay device coupled to the one or more processors, the delay device comprising: a delay controller; and a delay generator coupled to the delay controller, the delay generator being coupled to a transmission line, the transmission line coupling a signal generator and a device; the delay controller being configured to determine a signal path length from the signal generator to the device; and the delay generator being configured to add a delay to a signal to be transmitted over the transmission line in response to the delay controller determining the signal path length to the device, the signal having a desired phase at the device.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and the specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION

Figure 1:
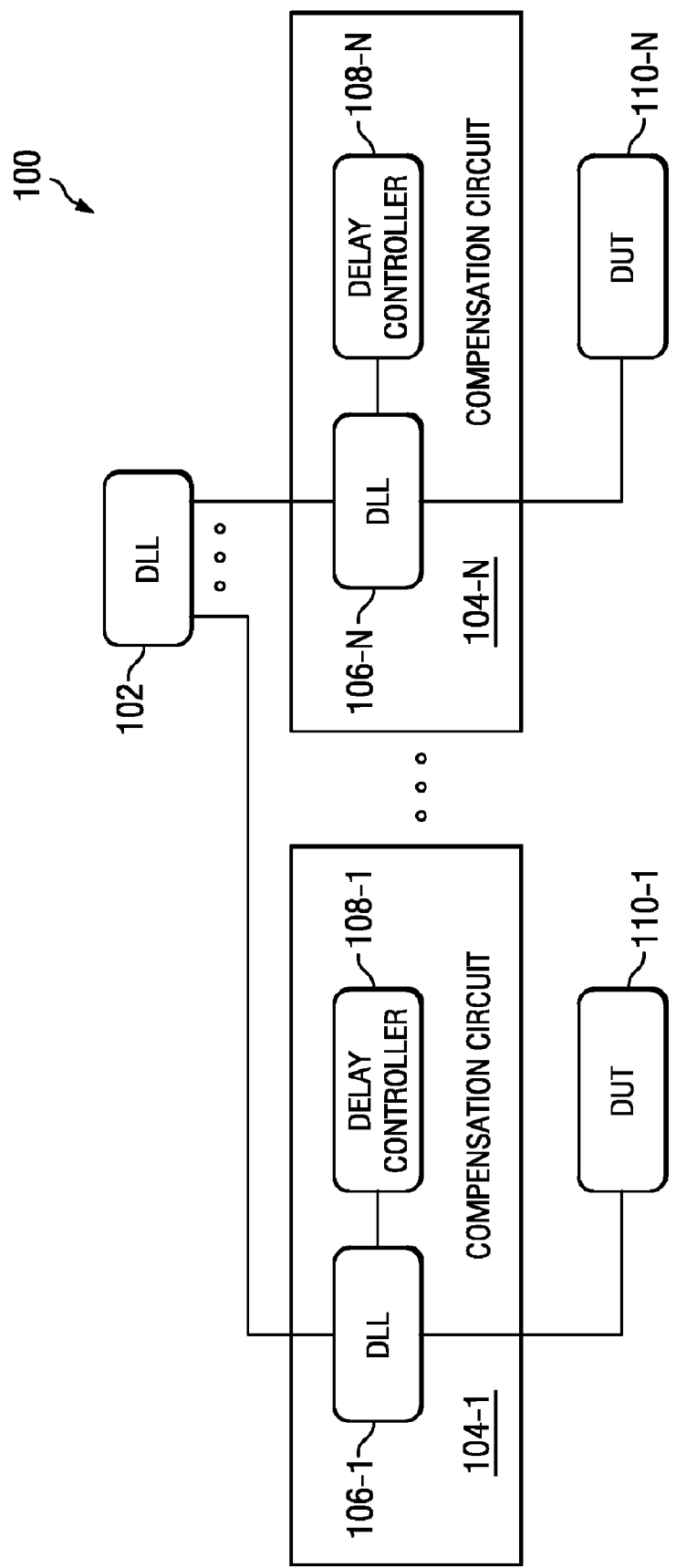
FIG. 1 is a block diagram illustrating an example of a conventional clock distribution network.

Refer now to the drawings wherein depicted elements are, for the sake of clarity, not necessarily shown to scale and wherein like or similar elements are designated by the same reference numeral through the several views.

Figure 2:
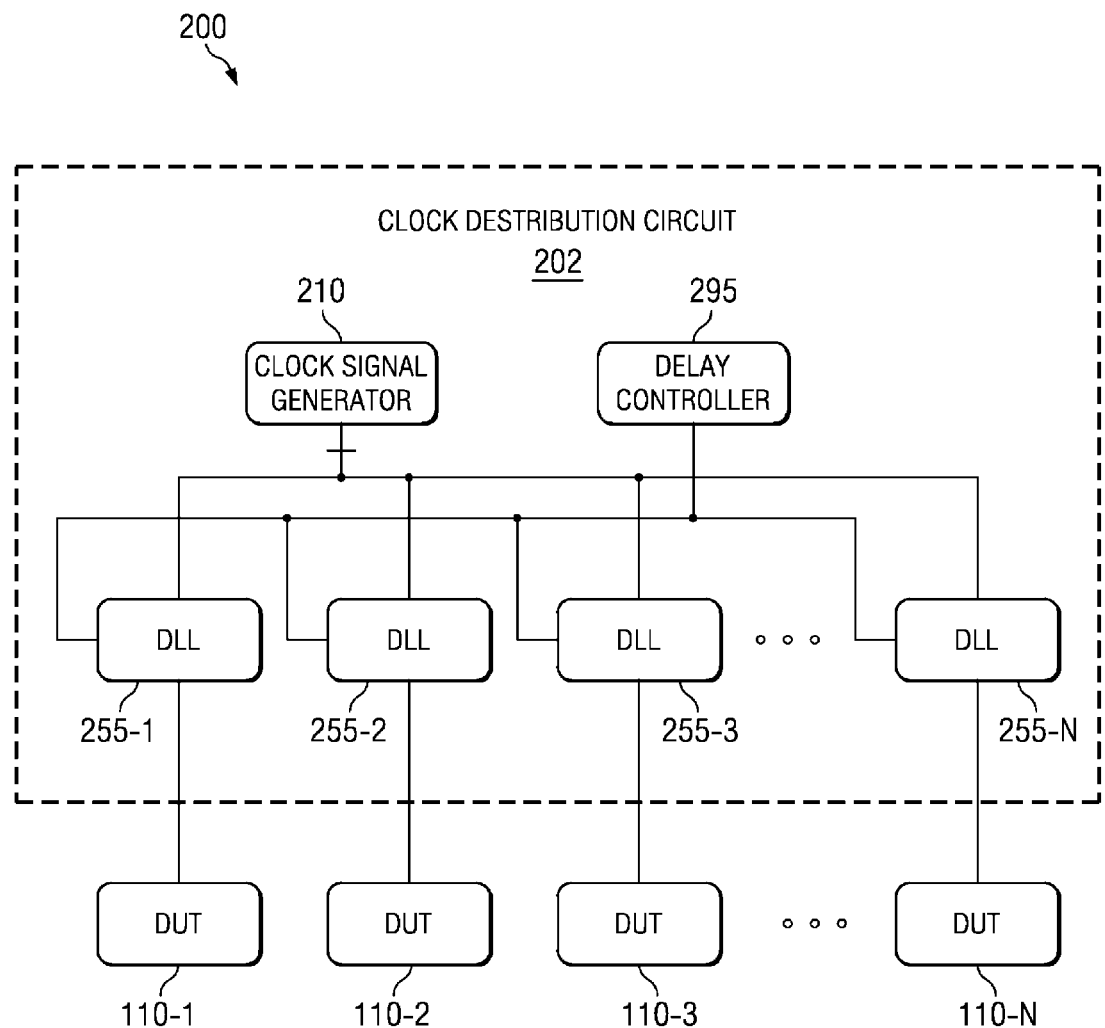
FIG. 2 is a block diagram illustrating a clock distribution network in accordance with a preferred embodiment of the present invention.

Turning to FIG. 2, a clock distribution network 200 in accordance with a preferred embodiment of the present invention can be seen. Clock distribution network 200 generally comprises a clock distribution circuit 202 that distributes clock signals to DUTs 110-1 to 110-N. Generally, clock signal generator 210 is configured to generate a clock signal, which is to be used to synchronize one or more of DUTs 110-1 to 110-N. Clock signal generator 210 may generally comprise a PLL coupled to a voltage-controlled crystal oscillator (VCXO).

Due to variations in the lengths of transmission lines between the clock distribution circuit 202 (in particular delay-lock loops (DLLs) 255-1 to 255-N) and the DUTs. 110-1 to 110-N, the clock signal may arrive at each of the DUTs 110-1 to 110-N with different and unpredicted phases. Delay controller 295 is configured to determine appropriate delay values to be added to each of the paths in order for the clock signals arriving at the devices to have an appropriate phase depending on the application. Namely, delay controller 295 determines the path lengths of transmission lines by (for example) transmitting measurement signals down each of the transmission lines and determining the time it takes for the reflected signals to return. After determining the signal path lengths of the transmission lines, delay controller 295 determines delay values to be added to the transmission lines to accomplish the desired phase. Delay controller 295 may then provide (or program) DLLs 255-1 to 255-N with the appropriate delay so that the DLLs 255-1 to 255-N can introduce the appropriate delays to the transmission lines. Additionally, the delay controller 295 may recompute appropriate delay values either periodically or on demand in order to ensure that the clock signals from the clock signal generator 210 continue to arrive at the DUTs 110-1 to 110-N with the appropriate phase values.

As an alternative to measuring reflections, delay controller 295 may use preprogrammed, predicted time values corresponding to each DUT 110-1 to 110-N to enable the delay controller 295 to reject false reflected signals that are not caused by the DUTs 110-1 to 110-N. Generally, delay controller 295 may be programmed with a predicted time and amplitude values so that DLLs 255-1 to 255-N can reject false reflected signals that are not caused by DUTs 110-1 to 110-N. That is, delay controller 295 may only keep measured time values and amplitudes that are within a certain range of the predicted time and amplitude values. The length may be computed, for example, by multiplying the velocity of the signal with half the time it takes for the measurement signal to return.

Figure 3:
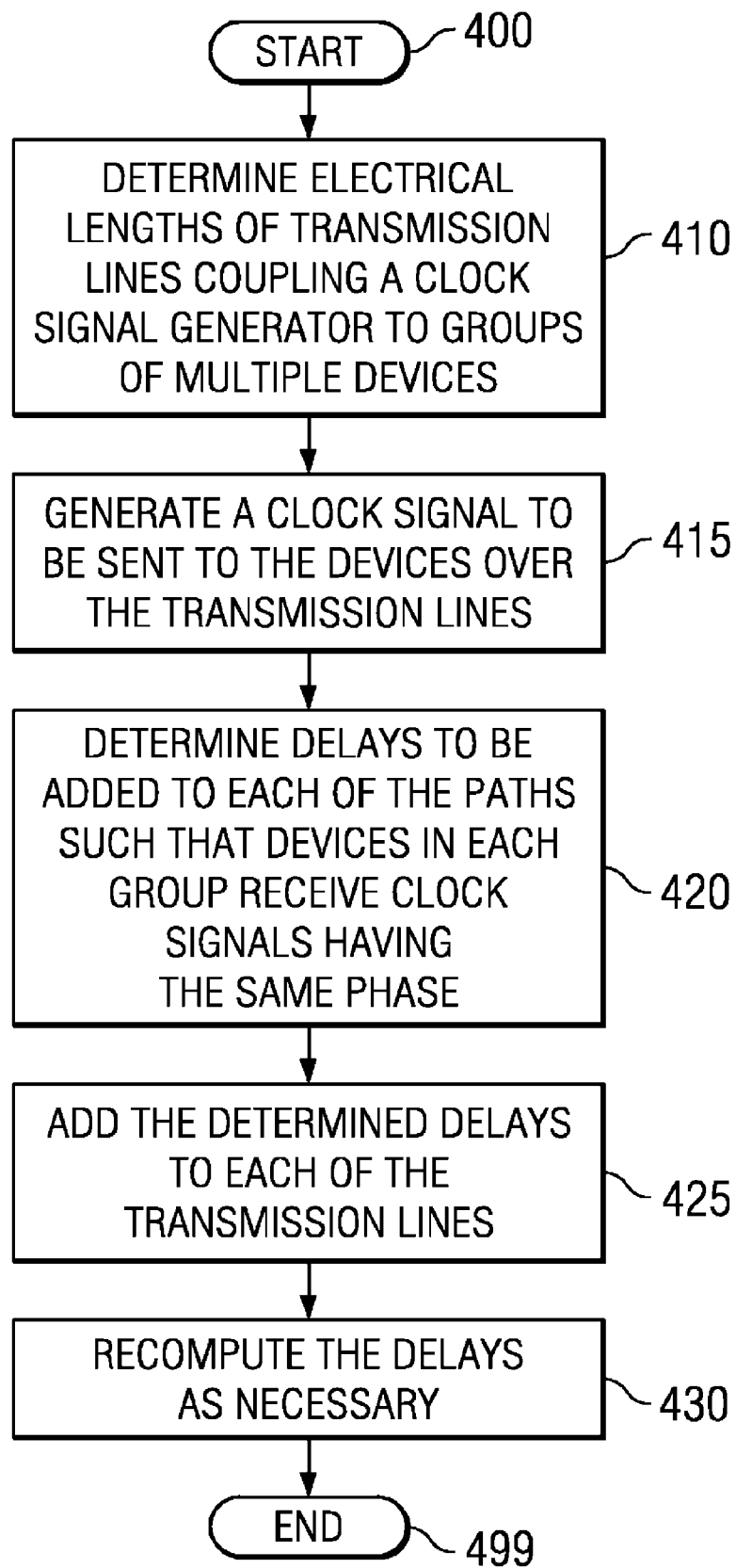
FIG. 3 is a flow chart depicting a method for determining and appropriately adjusting the delay of clock signals in accordance with a preferred embodiment of the present invention.

Turning now to FIG. 3, a flow chart depicting an example of FIG. 3 is a flow chart depicting a method for determining and appropriately adjusting the delay of clock signals in accordance with a preferred embodiment of the present invention.

Processing begins at 400, whereupon, at block 410, the lengths of transmission lines coupling a clock generator (i.e., clock signal generator 210) to groups of devices (i.e., DUTs 110-1 to 110-N) are determined. Due to variations in the lengths of the transmission lines, the clock signal from the clock generator (i.e., clock signal generator 210) may arrive at the devices (i.e., DUTs 110-1 to 110-N) having unpredicted phase values. Thus it may be necessary to measure the length of and introduce delays into the transmission lines to control the phase with which the clock signal will arrive at the devices (i.e., DUTs 110-1 to 110-N). To do this, at block 415, a clock signal is generated, which may be sent to the devices (i.e., DUTs 110-1 to 110-N) over the transmission lines in order to synchronize the devices. At block 420, a delay to be added to each transmission line is determined. The delays are such that the devices (i.e., DUTs 110-1 to 110-N) receive clock signals having a desired phase, where the delay values are (for example) determined using a provided (or preprogrammed) desired phase for each device and the electrical signal length for each transmission line. At block 425, the computed delays are added to the corresponding transmission lines in order to obtain the desired clock signal phase at each device. At block 430, the delay values may be recomputed as necessary (either periodically or on demand) to ensure that the signals from the signal generator continue to arrive at the devices having appropriate phase values. Processing subsequently ends at 499.

Having thus described the present invention by reference to certain of its preferred embodiments, it is noted that the embodiments disclosed are illustrative rather than limiting in nature and that a wide range of variations, modifications, changes, and substitutions are contemplated in the foregoing disclosure and, in some instances, some features of the present invention may be employed without a corresponding use of the other features. Accordingly, it is appropriate that the appended claims be construed broadly and in a manner consistent with the scope of the invention.

The invention claimed is:

1. An apparatus comprising:
   a clock signal generator;
   a plurality of delay-lock loops (DLLs) that are each coupled to the clock signal generator;
   a plurality of transmission lines, wherein each transmission line is coupled to at least one of the DLLs; and
   a delay controller that is coupled to each of the DLLs so as to control a delay for each DLL based at least in part on a length of its associated transmission line, wherein the delay controller computes the length of each transmission line based at least in part on a roundtrip time and amplitude for a reflection of a test signal transmitted over each transmission line.

2. The apparatus of claim 1, wherein the clock signal generator further comprises:
   a voltage-controlled crystal oscillator (VCXO); and
   a phase-lock loop (PLL) that is coupled to the VCXO.

3. The apparatus of claim 2, wherein the delay controller ignores false reflections using an estimated roundtrip time and an estimated amplitude for the test signal.

4. The apparatus of claim 3, wherein the apparatus further comprises a plurality of devices, wherein each device is coupled to at least one of the transmission lines.

* * * * *